United States Patent [19]
Imahori

[11] Patent Number: 5,721,785
[45] Date of Patent: Feb. 24, 1998

[54] SMALL-SIZED SOUND GENERATOR

[75] Inventor: Yoshio Imahori, Shizuoka, Japan

[73] Assignee: Star Micronics Co., Ltd., Shizuoka, Japan

[21] Appl. No.: 534,400

[22] Filed: Sep. 27, 1995

[30] Foreign Application Priority Data

Oct. 3, 1994 [JP] Japan .................................. 6-264515

[51] Int. Cl.⁶ .................................................. H04R 25/00
[52] U.S. Cl. .......................... 381/192; 381/203; 381/205
[58] Field of Search .................................. 381/193, 192, 381/203; 340/388, 391, 404; 367/175, 185

[56] References Cited

U.S. PATENT DOCUMENTS

| | | | |
|---|---|---|---|
| 5,394,479 | 2/1995 | Ishigaya et al. | 381/192 |
| 5,432,758 | 7/1995 | Sone | 381/193 |

*Primary Examiner*—Sinh Tran
*Attorney, Agent, or Firm*—Pollock, Vande Sande & Priddy

[57] ABSTRACT

The present invention is to provide a small-sized sound generator capable of simplifying the structures of terminals, facilitating surface mounting, and setting a sound emitting hole in an arbitrary direction. The small-sized sound generator includes a converting means housed in a housing for converting an electric signal into sound or oscillation, wherein conductors each having an arbitrary pattern are disposed on the surfaces of the housing so as to form terminals integrally with the housing.

11 Claims, 13 Drawing Sheets

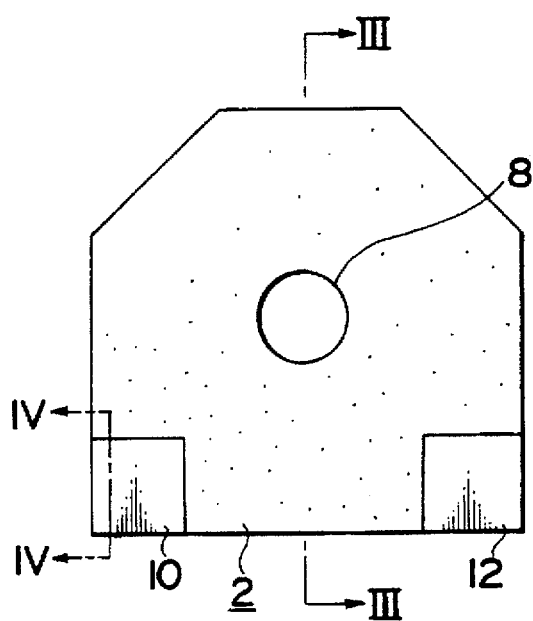
F I G. 2A
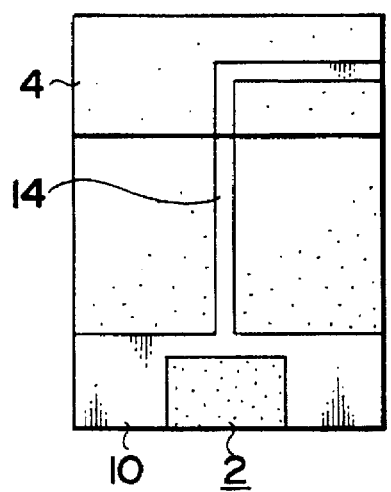
F I G. 2B

SMALL-SIZED SOUND GENERATOR

BACKGROUND OF THE INVENTION

Field of the Invention

The present invention relates to a sound/oscillation generator to be used as a notification means in a portable telephone or the like, namely, to a small-sized sound generator for generating sound and oscillation.

Description of the Prior Art

A small-sized sound generator has been used as a notification means in small-sized electronic equipment such as portable telephones, pager units and its form is illustrated in FIGS. 7 to 11.

The small-sized sound generator shown in FIG. 7 is a standard electroacoustic transducer comprising a housing 200 composed of an upper housing 202 and a lower housing 204 which are integrated with each other to form in a cylindrical shape, an electroacoustic transducer portion 206 housed in the housing 200, and lead terminals 208 and 210 respectively formed in a rod shape and disposed at a back side of the housing 200. In this small-sized sound generator, through holes 214 and 216 are formed on a circuit board 212, and the lead terminals 208 and 210 penetrate the through holes 214 and 216 and they are electrically connected to a conductive pattern 218 formed on the back side of the circuit board 212 by way of soldering. In this case, a sound emitting hole 219 formed in the upper housing 202 crosses at right angles to the circuit board 212, namely, it is directed upward.

The small-sized sound generator shown in FIG. 8 is different from that shown in FIG. 7, in that the housing 200 consists of a single housing whereas the embodiment in FIG. 7 consists of the integrated upper and lower housings. Other elements in FIG. 8 are the same as those in FIG. 7.

The small-sized sound generator shown in FIGS. 9A and 9B includes a fixing projection 220 formed at a side surface portion of the housing 200, and the lead terminals 208 and 210 formed at a board 256, which closes the back side of the housing 200, and positioned at both sides of the fixing projection 220, wherein each of the lead terminals 208 and 210 is made of a plate-shaped material bent in an L shape forming a flat portion 222 in a projecting direction of the fixing projection 220. Accordingly, when the small-sized sound generator is connected to the circuit board 212, the fixing projection 220 is inserted into a through hole 224 or a recess formed on the circuit board 212 so as to fix the housing 200 on the circuit board 212, and the flat portions 222 of the lead terminals 208 and 210 are electrically connected to a circuit conductor 226 on the circuit board 212 by soldering, etc. In this case, the sound emitting hole 219 formed in the housing 200 is directed in parallel with the circuit board 212.

The small-sized sound generator shown in FIG. 10 has the same housing 200 and the internal structure thereof as those of FIG. 8. The lead terminals 208 and 210 made of the plate-shaped material like those of FIG. 9 extend from the wall surface side of the housing 200 to the opposite side on which the sound emitting hole 219 is formed, where they are bent in an L shape to form flat portions 228. A through hole 230 is formed on the circuit board 212, and the sound emitting hole 219 is aligned with the through hole 230 so as to set the housing 200 on the circuit board 212. The flat portions 228 of the lead terminals 208 and 210 and the conductive pattern on the circuit board 212 are soldered to each other. This small-sized sound generator is characterized in that the configurations of the lead terminals 208 and 210 are modified so as to emit sound through the circuit board 212.

The small-sized sound generator shown in FIGS. 11A and 11B includes a housing 200 of flat rectangular parallelepiped having each side of several millimeters, and the electroacoustic transducer portion 206 housed in the housing 200, wherein a positive lead terminal 208 and a dummy terminal 209 are provided at one side surface of a long side of the housing 200, and a negative lead terminal 210 and a dummy terminal 211 are provided at the other side surface of the long side of the housing 200. Each of the lead terminals 208 and 210 is provided for surface mounting and each of the dummy terminals 209 and 211 is for fixing purpose. The housing 200 comprises the upper housing 202 of rectangular parallelepiped and a plate-shaped lower housing 204 which are integrated with each other, wherein a pair of positioning projections 232 are formed at the back side of the lower housing 204. In such a very small-sized sound generator, the positioning projections 232 are inserted into positioning through holes 234 formed on the circuit board 212 so as to position the housing 200, while the lead terminals 208 and 210 and the dummy terminals 209 and 211 are soldered to the conductive pattern on the circuit board 212 so as to electrically connect these terminals to the conductive pattern.

One of the reasons why such a small-sized sound generator takes various mounting forms is to set the direction of the sound emitting hole 219 since the sound emitting hole 219 has directivity relative to an emitting direction of the oscillating energy.

In the prior art small-sized sound generator, the electroacoustic transducer portion 206 is housed in the housing 200, wherein the electroacoustic transducer portion 206 comprises a base 242 comprising a pole piece 240, a core 244 provided upright on the base 242, and a coil 246 wound around the core 244, and an annular magnet 248 is disposed around a peripheral surface of the coil 246. A diaphragm 250 made of a magnetic material is disposed on an inner wall portion of the housing 200, wherein magnetic force of the annular magnet 248 acts upon the diaphragm 250 and also acts upon the core 244 through the base 242 so as to form a closed magnetic path through a gap 252. The coil 246 is energized by an ac signal applied to the lead terminals 208 and 210 and is magnetized by an alternating magnetic field in response to an electric signal to be applied to the core 244. As a result, the diaphragm 250 is oscillated by the alternating magnetic field so as to permit a resonant chamber 254 to resonate so that the oscillation or sound is emitted from the sound emitting hole 219 while the oscillating energy is effectively emitted toward an opening direction thereof. Accordingly, the mounting form of the small-sized sound generator, namely, the directivity of the sound emitting hole 219 is important in the electronic equipments.

In the prior art small-sized sound generator, the lead terminals 208 and 210 per se are changed or the shapes of the lead terminals 208 and 210 are changed to cope with various mounting forms. However, the shape of the small-sized sound generator is complex by such a partial change of the shapes of the lead terminals 208 and 210. Further, since the lead terminals 208 and 210 are individual assembly parts, as the number of parts increases, the small-sized sound generator is prevented from being miniaturized, and assembling steps increase. Still further, when the lead terminals 208 and 210, which are drawn from the board 256 provided on the back side of the base 242 or the housing 200 made of synthetic resin, are subjected to bending, excessive stress is applied between the lead terminals 208 and 210. The portions where they are fixed generate cracks in the housing 200 or the board 256, and further make it difficult to position the lead terminals 208 and 210 relative to the housing 200 with accuracy so that the connection between the circuit conductor 226 and the lead terminals 208 and 210 are made unstable.

SUMMARY OF THE INVENTION

It is therefore an object of the present invention to provide a small-sized sound generator capable of simplifying structures of terminals, facilitating surface mounting, and setting a direction of the sound emitting hole to an arbitrary direction.

To achieve the above object, a small-sized sound generator (52A, 52B, 52C, 52D), such as shown in FIG. 6, according to a first aspect of the invention includes parts shown in FIG. 3, namely a housing (2), a converting means (electroacoustic transducer portion 18) housed in the housing (2) for converting an electric signal into sound or oscillation, and conductors disposed on surfaces of the housing (2), each conductor having an arbitrary pattern so as to form terminals (10, 12) shown in FIG. 3 to be integrally formed with the housing.

Accordingly, in the small-sized sound generator according to the first embodiment, the conductors each have an arbitrary pattern disposed on the surfaces of the housing so that the terminals are integrally formed with the housing. That is, the housing per se constitutes a part of the terminals wherein lead terminals as assembling parts are not present like the prior art small-sized sound generator. The number of parts are reduced by the number of lead terminals so that the terminal structure can be simplified to thereby miniaturize the small-sized sound generator. When the small-sized sound generator is connected to the circuit board, terminals of the housing are brought into contact with the conductive pattern on the circuit board and the former is electrically connected to the latter by a connecting means such as soldering.

A small-sized sound generator according to a modification of the first embodiment is characterized in that the housing (2) has a shape of polyhedron and conductors each having an arbitrary pattern are disposed on the surface of the housing (2) for forming terminals integrally with the housing (2).

Since the housing (2) has a shape of polyhedron and the conductors each having the arbitrary pattern are disposed on the surfaces of the housing to form terminals, each surface of the housing constituting the polyhedron becomes a connecting surface, i.e., a mounting surface on the circuit board. As a result, supposing that a sound emitting hole is formed on a specific surface, the terminals on the housing can be connected to the circuit board with the specific surface directed to an arbitrary direction, so that the sound emitting hole having directional can be directed to the arbitrary direction. Terminals can be formed on the surfaces of the housing on which the sound emitting hole is formed, and the terminals connected to the circuit board, whereby the sound emitting hole can be directed toward the circuit board so that the sound can be emitted so as to penetrate the circuit board.

Still further, the small-sized sound generator according to a second aspect of the invention FIGS. 5A–5D is characterized in that projections (44, 46, 48, 50) are formed on a part of the housing (2) and the conductors are disposed on the projections to form terminals.

That is, if the projections are formed on the part of the housing, the conductors are disposed on the projections to form the terminals, which can cope with a connecting form other than the surface mounting. The projections can be utilized as temporarily fixing means to the circuit board, etc., or positioning means. In this case, although the other terminals serve as the electric connections, the positioning and fixing by the projections, and soldering of the terminals, etc. render the connection and fixing firm, which contributes to the reliability of the circuit connection. The shapes of the projections may be either columnar or plate-shaped. If the plate-shaped projections are formed so as to extend a part of the housing, the housing can be electrically connected to the circuit board, and the projections can be fixed to the circuit board by fixing means such as a screw so that the fixing can be more stabilized.

The terminals may be formed on the surface of the housing made of synthetic resin. Accordingly, as shown in FIG. 4, a metallic plate having an arbitrary pattern may be applied to, on, or embedded in the surfaces of the housing to form the terminals. Conductive layers (substrate plating layer 105, protecting plating layer 107, finished plating layer 109) may be formed by plating, or the conductive layers may be formed by printing, etc.

In a small-sized sound generator according to the present invention the terminals can be easily formed by various methods, e.g., embedding a metallic plate in, or plating the metallic layer on, or printing the metallic layer on the housing made of synthetic resin. The most proper method can be selected from the aforementioned methods depending on the shape of the housing, i.e., concave, cornered, plane surface, etc. so that yield and reliability can be enhanced.

BRIEF DESCRIPTION OF THE DRAWINGS

FIGS. 2A to 2E show each surface of the small-sized sound generator in FIG. 1, in which FIG. 2A is a front view, FIG. 2B is a right side view, FIG. 2C is a left side view, FIG. 2D is a rear view and FIG. 2E is a bottom view;

FIGS. 5A to 5D show a small-sized sound generator according to a second embodiment of the present invention, in which FIG. 5A is a front view, FIG. 5B is a right side view, FIG. 5C is a rear view and FIG. 5D is a bottom view;

FIGS. 9A and 9B show a third prior art small-sized sound generator in which FIG. 9A is a rear view of the small-sized sound generator and FIG. 9B is a cross-sectional view showing a mounting form of the small-sized sound generator;

FIGS. 11A and 11B show a fifth prior art small-sized sound generator in which FIG. 11A is a horizontal cross-sectional view of the small-sized sound generator and FIG. 11B is a front view showing a mounting form of the small-sized sound generator.

DETAILED DESCRIPTION OF THE PREFERRED EMBODIMENTS

The present invention will be described more in detail with reference to the attached drawings.

Figure 1:
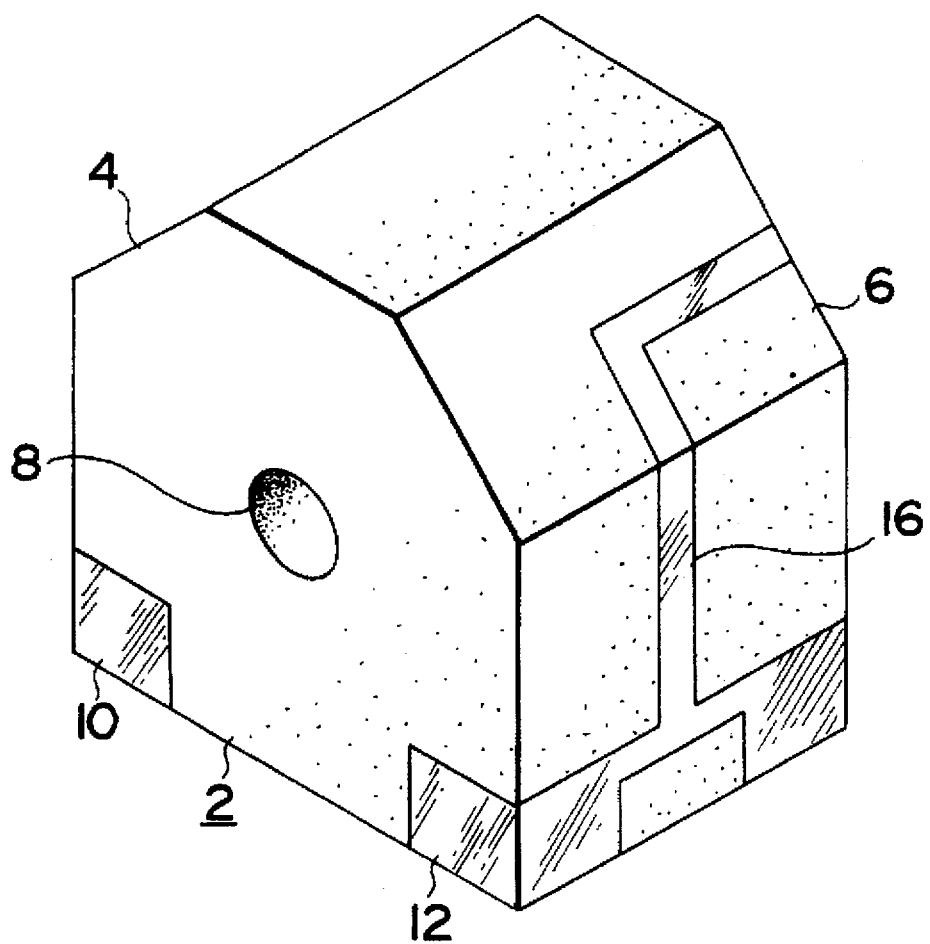
FIG. 1 is a perspective view of a small-sized sound generator according to a first embodiment of the present invention.
Figure 2C:
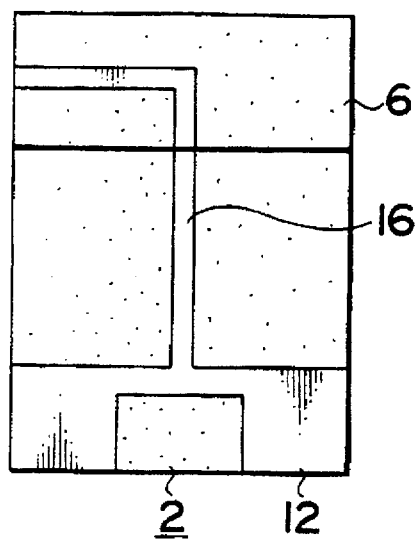
Figure 2D:
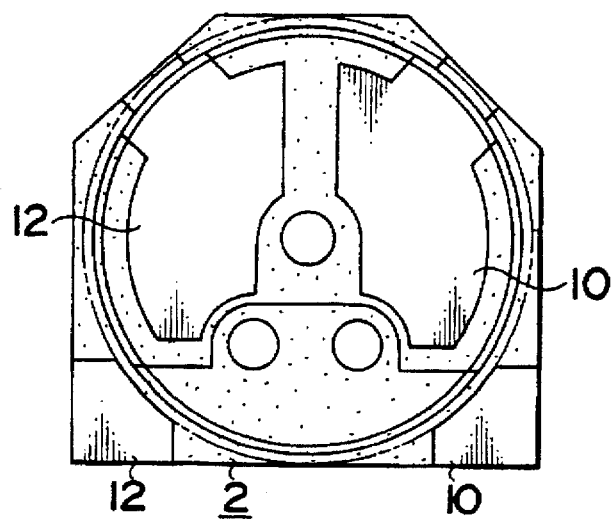
Figure 2E:
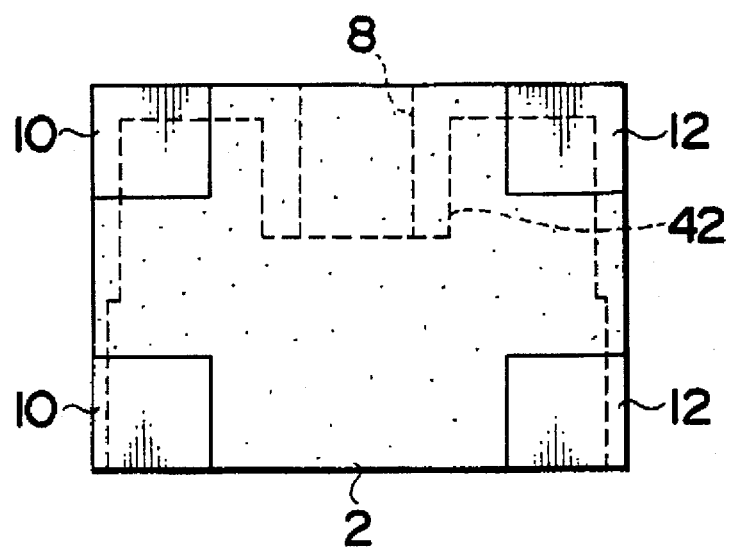
Figure 3:
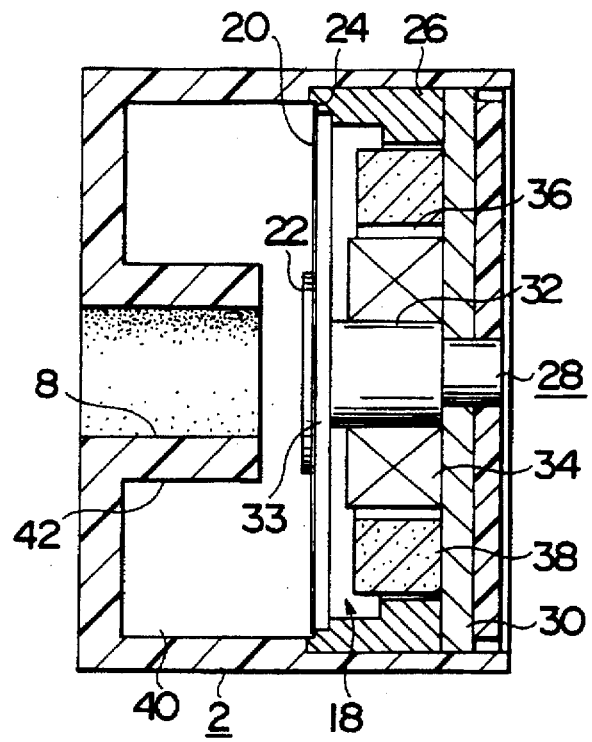
FIG. 3 is a cross-sectional view taken along lines III—III of FIG. 2A.

First Embodiment (FIGS. 1 to 4):

FIGS. 1, 2 and 3 show a small-sized sound generator according to a first embodiment of the present invention. In the small-sized sound generator of the first embodiment, there is formed a housing 2 made of insulating synthetic resin for forming a shape of polyhedron, wherein the housing 2 is formed of an octahedron having surfaces 4 and 6 on a rectangular parallelepiped. The housing 2 is opened at the back side thereof and has a circular sound emitting hole 8 at the front side thereof.

A pair of terminals 10 and 12 are integrally formed with the housing 2 by conductors each forming a continuous pattern on a front surface, left and right surfaces, a rear surface and a bottom surface of the housing 2. The terminals 10 and 12 form surface mounting terminals for permitting each surface of the housing 2 to serve as a connecting surface, i.e., a mounting surface. In the first embodiment, although each of the terminals 10 and 12 has the same pattern, each pattern is not necessary to be conformed to each other. The reason why each of the terminals 10 and 12 is partially rectangular to occupy a large area is for convenience of connections thereof. L-shaped extension terminal portions 14 and 16 are formed at the side surface portions of the housing 2, wherein the terminals 10 and 12 at the side surface portions and each of the terminals 10 and 12 formed at the rear surface portion are electrically connected with each other through the extension terminal portions 14 and 16. These terminals 10 and 12 and the extension terminal portions 14 and 16 are formed, for example, by forming protection plating layer on the surfaces of conductive layers made of copper, etc.

Figure 4:
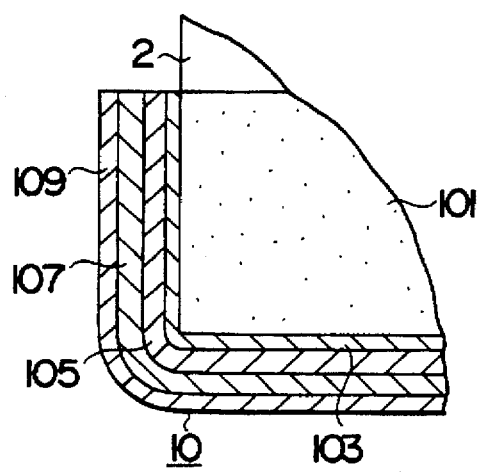
FIG. 4 is a cross-sectional view taken along lines IV—IV of FIG. 2A.

FIG. 4 is a cross-sectional view taken along lines IV—IV of FIG. 2 in which the terminal 10 comprises a conductor forming portion 101 formed on the surface of the housing 2, a catalyst layer 103, a substrate plating layer 105 comprising copper, etc., a protection plating layer 107 such as a nickel plating layer, etc., a finishing plating layer 109 such as a metallic layer, etc. That is, the substrate plating layer 105, the protection plating layer 107 and the finishing plating layer 109 are respectively formed as a conductive layer, and the terminal 12 is structured in the same manner as the terminal 10.

An electroacoustic transducer portion 18 is housed in the housing 2 as a converting means for converting an electric signal into sound or oscillation as shown in FIG. 3. That is, a diaphragm 20 is disposed inside the housing 2 as the converting means for converting magnetic oscillation into a mechanical oscillation. The diaphragm 20 is formed of a thin plate made of magnetic material and has a magnetic piece 22 fixed to the center thereof as a means for substantially increasing mass. The diaphragm 20 is supported by a concave portion 24 formed inside the housing 2 and a top portion of a supporting ring 26 as a supporting means disposed in the housing 2 while edge portions of the diaphragm 20 is clamped between the concave portion 24 and the top portion of the supporting ring 26. A pole piece 28 is disposed in the housing 2, and it includes a columnar core 32 which is provided upright on the center of a discoidal base 30, wherein a gap 33 is defined between the core 32 and the diaphragm 20. The base 30 and the core 32 are respectively made of magnetic materials. The base 30 is fixed to the housing 2, and a central axis of the core 32 conforms to the center of the diaphragm 20. A cylindrical coil 34 is wound around the core 32, and distal ends of the coil 34 are connected to the terminals 10 and 12. An annular magnet 38 is disposed around the peripheral surface of the coil 34 with a gap 36 being defined therebetween. The annular magnet 38 is positioned by an inner diameter portion of the supporting ring 26. The annular magnet 38, the pole piece 28 and the diaphragm 20 form a closed magnetic path, wherein magnetic force of the annular magnet 38 functions as attraction of the diaphragm 20 serving as a biased magnetic field.

A resonant space 40 is defined at the upper side of the diaphragm 20, and a sound emitting cylinder 42 having the sound emitting hole 8 is formed for opening the resonant space 40 to the atmosphere.

In the small-sized sound generator having such an arrangement, when an ac input signal is applied between the terminals 10 and 12 on the arbitrary surfaces of the housing 2 to thereby energize the coil 34, the core 32 and the base 30 are magnetized by the alternating magnetic field which is generated by the coil 34, so that the alternating magnetic field oscillates the diaphragm 20 vertically through the closed magnetic path. The oscillation depends on the frequency of the ac input signal, which results in resonating the resonant space 40. The resonating oscillation and the resonating sound oscillate the housing 2 and are emitted to the atmosphere through the sound emitting hole 8.

Figure 5A:
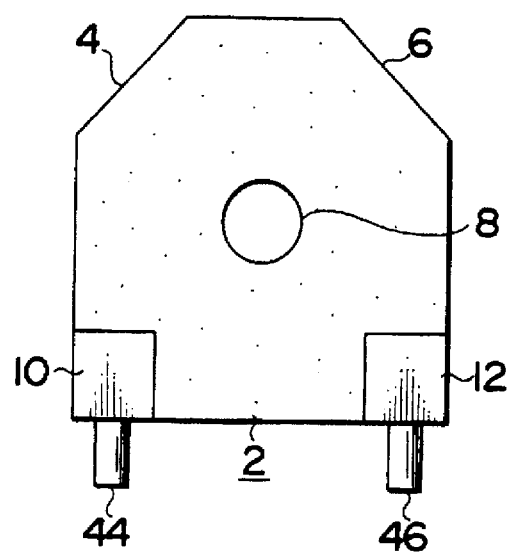
Figure 5B:
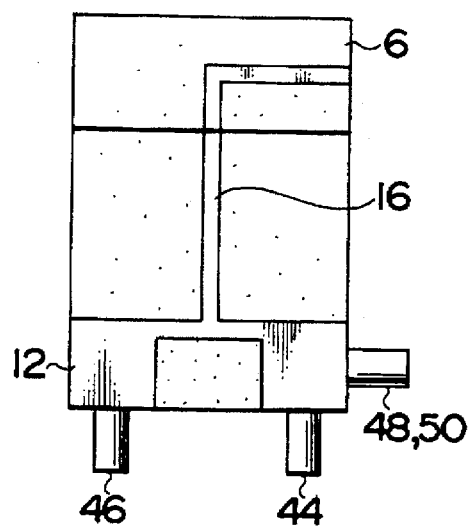
Figure 5C:
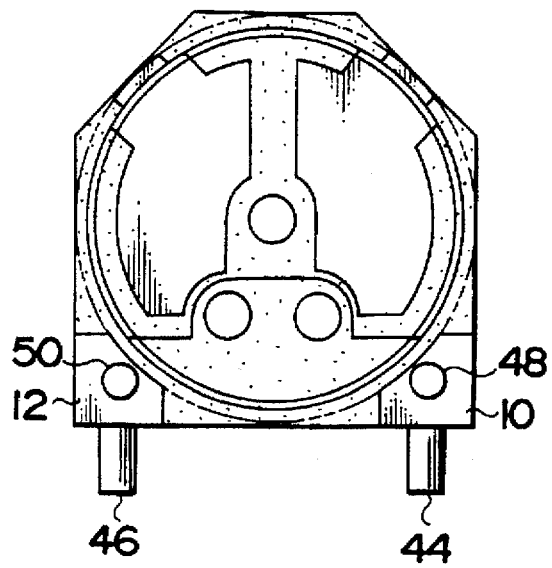
Figure 5D:
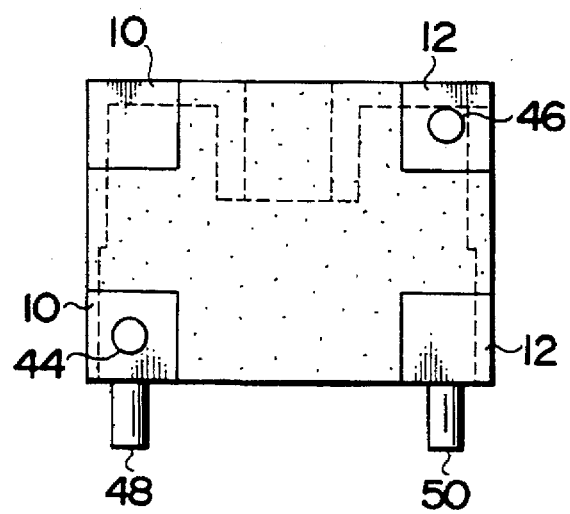

Second Embodiment (FIGS. 5A and 5B):

FIGS. 5A to 5D show a small-sized sound generator according to the second embodiment of the present invention.

The small-sized sound generator comprises projections 44 and 46 serving as terminal pins on the terminals 10 and 12 of the bottom surface of the housing 2, and projections 48 and 50 serving as terminal pins on the terminal 10 and 12 of the rear surface of the housing 2. Each of the projections 44, 46, 48, 50 is columnar, wherein the projections 44 and 46 are disposed diagonally on the bottom surface. Four projections 44 and 46 may be disposed diagonally on the bottom surface. These projections 44, 46 and 48, 50 constitute a part of the terminals 10 and 12 by providing conductors on the surfaces thereof. An internal structure of the small-sized sound generator of the second embodiment is the same as that of the first embodiment.

Figure 6:
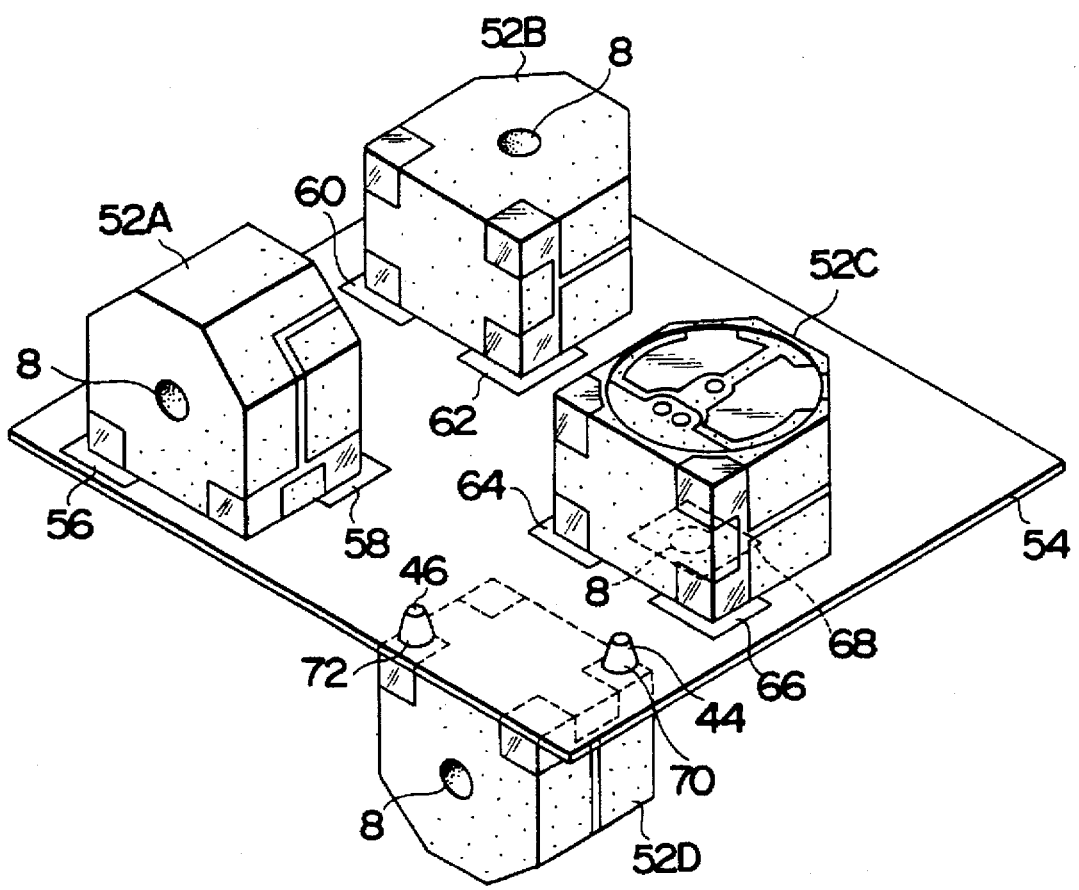
FIG. 6 is a perspective view showing a mounting form of the small-sized sound generator of the present invention.
Figure 7:
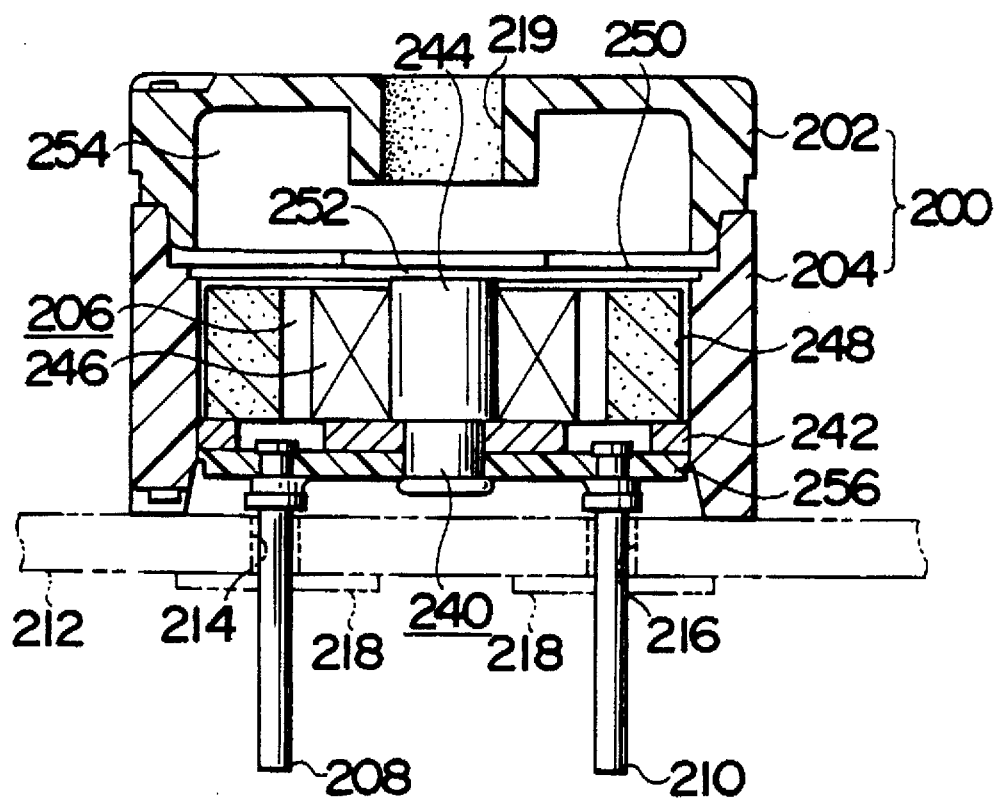
FIG. 7 is a cross-sectional view of a first prior art small-sized sound generator and its mounting form.
Figure 8:
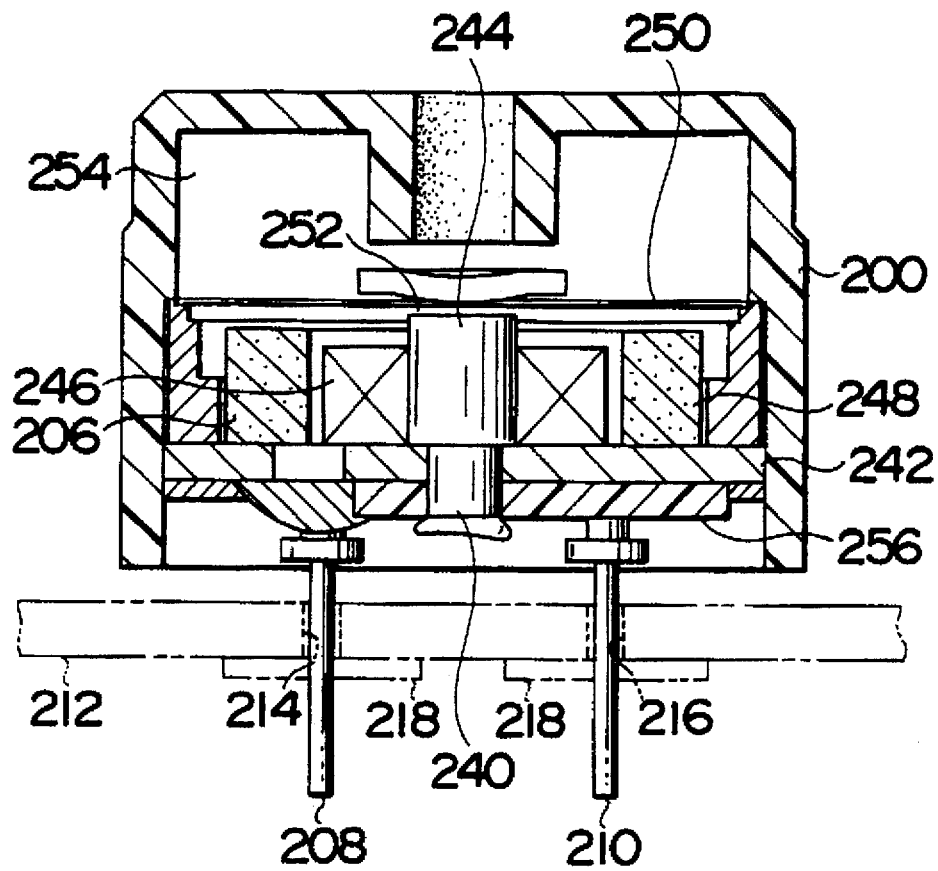
FIG. 8 is a cross-sectional view of a second prior art small-sized sound generator and its mounting form.
Figure 9A:
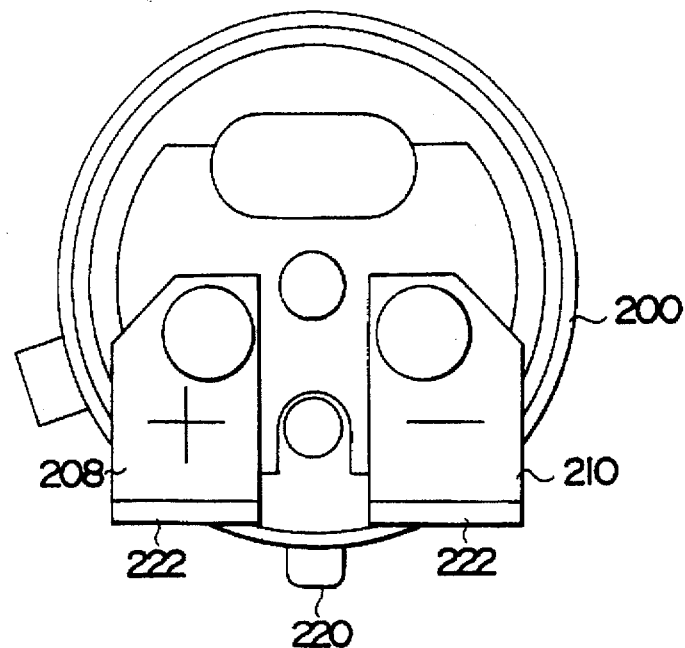
Figure 9B:
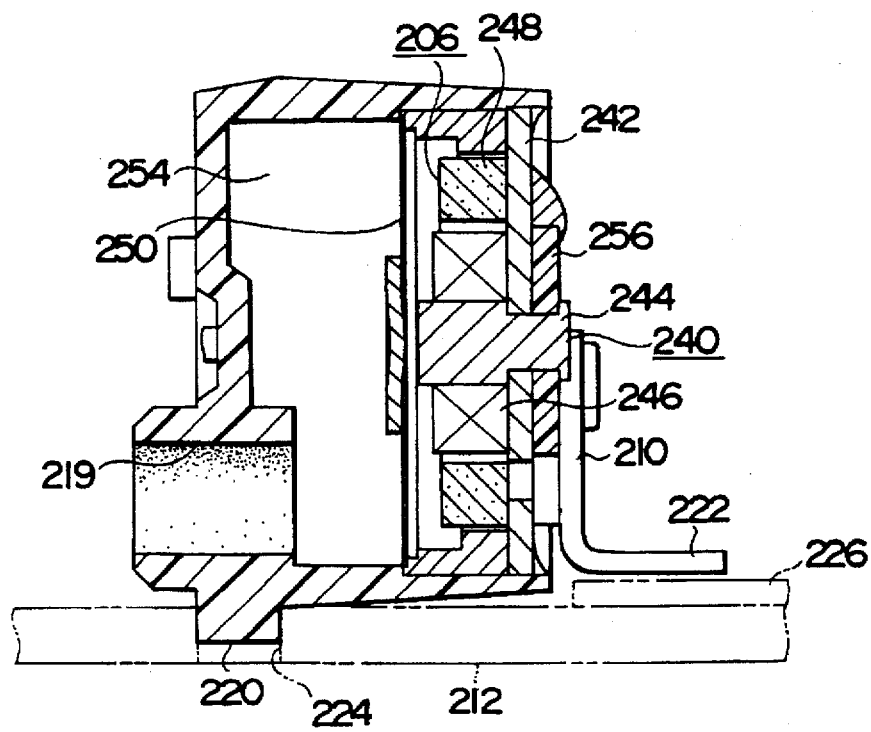
Figure 10:
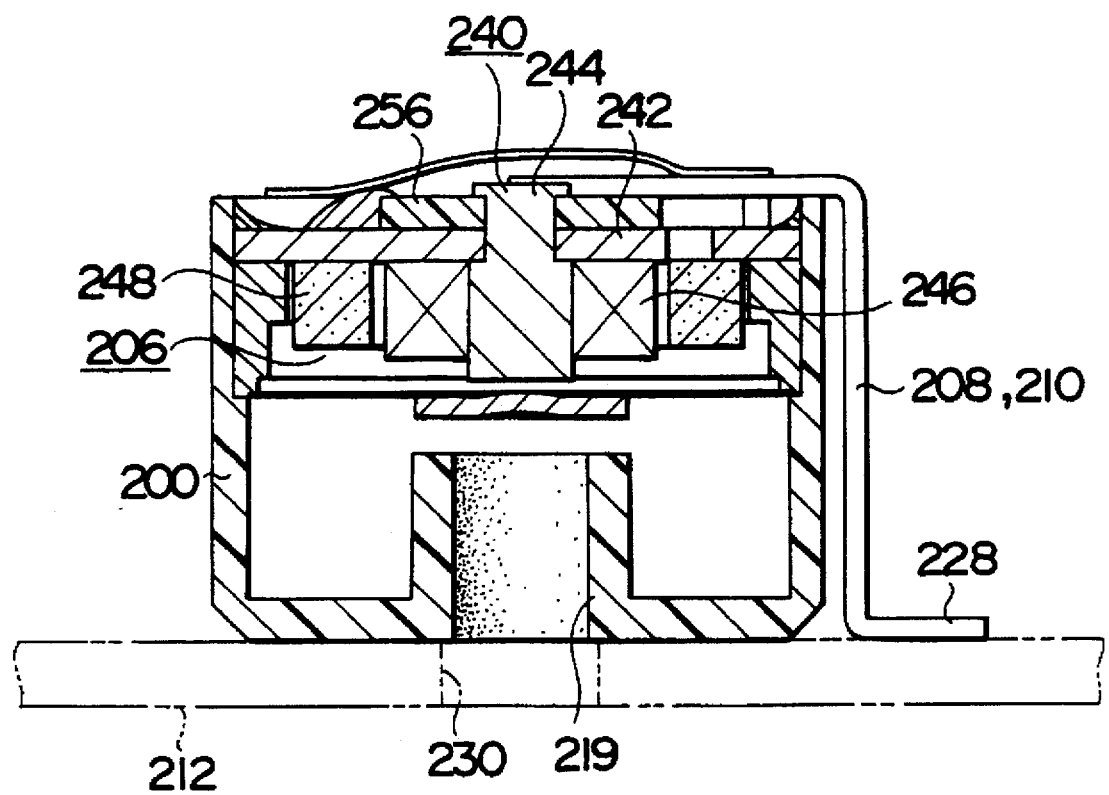
FIG. 10 is a cross-sectional view of a fourth prior art small-sized sound generator and its mounting form.
Figure 11A:
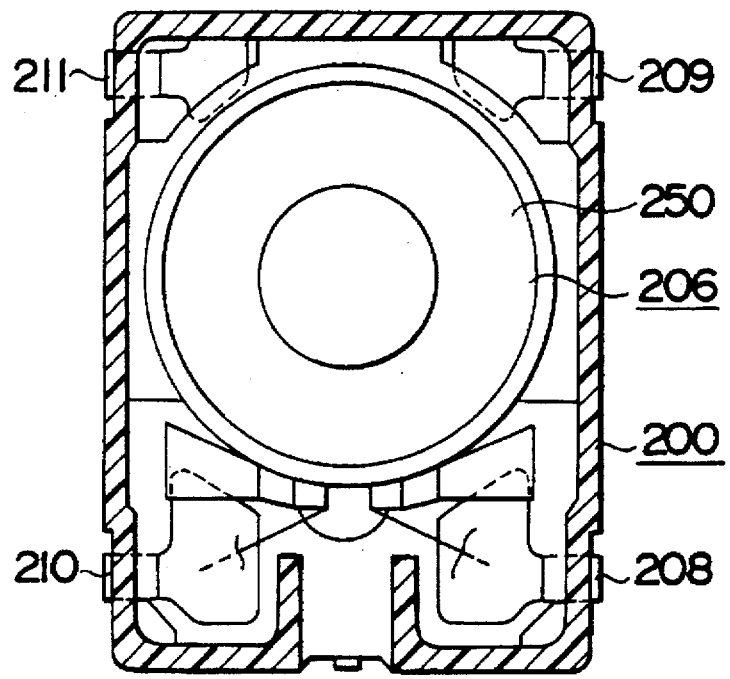
Figure 11B:
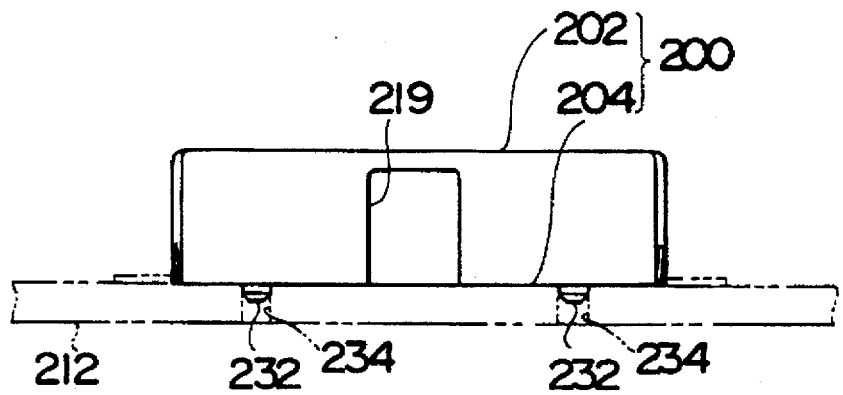

Since the terminals 10 and 12 are formed in each surface of the housing 2, various mounting forms can be taken as shown in FIG. 6. Denoted at 52A, 52B and 52C show the small-sized sound generator of the first embodiment and 52D shows the small-sized sound generator of the second embodiment.

In the small-sized sound generator 52A, circuit conductors 56 and 58 are formed diagonally on a circuit board 54 wherein the terminals 10 and 12 on the bottom surface of the housing 2 are soldered to the circuit conductors 56 and 58. As a result, the sound emitting hole 8 of the small-sized sound generator 52A is directed in parallel with the circuit board 54.

In the small-sized sound generator 52B, circuit conductors 60 and 62 are disposed in parallel with each other on the circuit board 54 wherein the terminals 10 and 12 on the rear surface of the housing 2 are soldered to the circuit conductors 60 and 62. As a result, the sound emitting hole 8 of the small-sized sound generator 52B is directed upward.

In the small-sized sound generator 52C, circuit conductors 64 and 66 are disposed in parallel with each other on the circuit board 54 wherein the terminals 10 and 12 on the front surface of the housing 2 are soldered to the circuit conductors 64 and 66. In this case, the circuit board 54 has, e.g., a rectangular opening 68 corresponding to the sound emitting hole 8, wherein sound is emitted from the sound emitting hole 8 through the rectangular opening 68 of the circuit board 54.

In the small-sized sound generator 52D, the projections 44 and 46 forming a part of the terminals 10 and 12 penetrate the through hole formed on the circuit board 54, wherein the projections 44 and 46 and each of circuit conductors 70 and 72 are individually soldered to each other. In this case, the projections 44 and 46 are inserted into and temporarily fixed to the circuit board 54 so as to serve as a fixing means. In such a mounting form, the small-sized sound generator 52D can be mounted on the back side of the circuit board 54 like the small-sized sound generator 52A.

Although the terminals are formed by a plating process according to the first and second embodiments, the terminals 10 and 12 can be formed by a conductor forming process such as a conductor printing or spattering. The terminals 10 and 12 may be formed by applying or embedding a metallic plate such as a metallic film with its metal surface exposed to or in the housing 2.

The following advantages can be obtained in the first and second embodiments of the present invention.

a. Since the terminals capable of performing surface mounting are formed on a plurality of surfaces of the housing having a shape of polyhedron, each surface of the housing can be a mounting surface so that the mounting can be made in plural directions, and the terminal structure can be simplified. Since the mounting can be made on each surface of the housing, the sound emitting hole can be set to an arbitrary direction.

b. Since the positioning of the sound emitting hole formed in the housing relative to the lead terminals and the shapes and dimensions thereof are improved in accuracy, the sound generator can be attached to a wiring board with stabilized accuracy, and the setting position of the sound emitting hole can be improved in accuracy.

c. Since the terminals are formed on the surfaces of the housing, the number of parts can be reduced, and the ratio of an area occupied by the lead terminals to the overall size of the small-sized sound generator is reduced compared with the prior art small-sized sound generator employing the lead terminals composed of wires or pins, so that the small-sized sound generator can be miniaturized as a product, simplified in assembling, reduced in the number of processes, and assembled automatically.

d. Since the terminals can employ resin which is chemically stable as a base material, impurities are not deposited on the terminal plating layer so as to stabilize the soldering wettability and enhance the reliability of connections.

e. Since the terminals are integrated with the housing, deformation by an external force can be prevented.

The present invention is not limited to the aforementioned first and second embodiments but includes various modifications and applications to achieve the object of the present invention.

What is claimed is:

1. A small-sized sound generator for receiving an electric signal to be converted into sound or oscillation, converting the electric signal into an oscillating magnetic field, oscillating a diaphragm by the oscillating magnetic field (magnetic oscillation) so as to generate sound or oscillation, said generator comprising:

a housing made of an insulating material and forming a shape of polyhedron, where the housing houses therein the diaphragm, a resonant chamber formed in front of the diaphragm so as to resonate with the oscillation of the diaphragm, a sound emitting hole for permitting the resonant chamber to open to the atmosphere so as to generate sound or oscillation, and an electromagnetic converting portion including a coil (electroacoustic transducer portion) disposed at a back side of the diaphragm for converting the electric signal into the oscillating magnetic field so as to oscillate the diaphragm;

terminals comprising conductors formed at an outer periphery of the housing forming the shape of polyhedron, each conductor having an arbitrary pattern on the surface of the polyhedron housing;

wherein the terminals are integrated with the housing and are electrically connected with the coil; and wherein the terminals are connected with an external device while selecting an arbitrary surface of the housing so as to set a direction of the sound emitting hole to an arbitrary direction.

2. The small-sized sound generator according to claim 1, wherein the housing is made of synthetic resin, and has projections made of synthetic resin and formed on a part of the housing, and the conductors are disposed on the projections so as to form the terminals.

3. The small-sized sound generator according to claim 1, wherein the terminals are formed by bonding or embedding metallic plate having the arbitrary pattern on the surfaces of the housing made of synthetic resin.

4. The small-sized sound generator according to claim 1, wherein the terminals are formed by plating conductive layers each having the arbitrary pattern on the surfaces of the housing made of synthetic resin.

5. The small-sized sound generator according to claim 1, wherein the terminals are formed by printing conductive layers each having the arbitrary pattern on the surfaces of the housing made of synthetic resin.

6. A sound generator mountable to a printed circuit board for converting an electrical signal into sound and comprising:

an insulative housing having a polyhedron shape;

electromagnetic means enclosed within the housing and cooperating with a diaphragm also enclosed within the housing for generating the sound;

the housing having an opening formed therein for allowing the generated sound to exit the interior of the housing when an electrical signal is applied to the electromagnetic means;

at least three sets of conductive terminals located on at least three corresponding surfaces of the housing, the terminals mounted to the housing and having planar outer surfaces that are flush with their respective housing surfaces; and means for connecting terminal portions, enclosed within the housing, to the electromagnetic means;

the housing being rotatable in a plurality of positions relative to the printed circuit board to which it is connected, thereby allowing an axis of the opening to assume a corresponding plurality of directions relative to the board.

7. The structure set forth in claim 6 wherein each set of terminals has a preselected pattern on a corresponding surface of the housing.

8. The structure set forth in claim 6 wherein the housing is fabricated of synthetic resin, the terminals further comprising:

projections integrally extending outwardly from the planar outer surfaces;

and a conductive layer formed over the projections to allow their electrical connection to the printed circuit board.

9. The structure set forth in claim 6 wherein the terminals are bonded or embedded metal plates.

10. The structure set forth in claim 6 wherein the terminals are plated conductive layers.

11. The structure set forth in claim 6 wherein the terminals are printed conductive layers.

* * * * *